United States Patent
Yeo et al.

(10) Patent No.: US 7,587,401 B2
(45) Date of Patent: Sep. 8, 2009

(54) METHODS AND APPARATUS TO COMPRESS DATASETS USING PROXIES

(75) Inventors: Boon-Lock Yeo, Los Altos Hills, CA (US); Zhenhua Zhang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 290 days.

(21) Appl. No.: 10/547,140

(22) PCT Filed: Mar. 10, 2005

(86) PCT No.: PCT/US2005/008077

§ 371 (c)(1),
(2), (4) Date: Aug. 24, 2005

(87) PCT Pub. No.: WO2006/098720

PCT Pub. Date: Sep. 21, 2006

(65) Prior Publication Data

US 2006/0259448 A1    Nov. 16, 2006

(51) Int. Cl.
*G06F 17/00* (2006.01)
(52) U.S. Cl. ........................ 707/101; 708/203
(58) Field of Classification Search ........... None
See application file for complete search history.

(56) References Cited

U.S. PATENT DOCUMENTS

| | | | | |
|---|---|---|---|---|
| 5,680,611 A | * | 10/1997 | Rail et al. | 707/101 |
| 5,838,963 A | * | 11/1998 | Griffiths | 707/6 |
| 5,864,860 A | * | 1/1999 | Holmes | 707/101 |
| 5,893,102 A | * | 4/1999 | Maimone et al. | 707/101 |
| 5,936,560 A | * | 8/1999 | Higuchi | 341/106 |
| 7,026,962 B1 | * | 4/2006 | Emami et al. | 341/51 |
| 7,103,608 B1 | * | 9/2006 | Ozbutun et al. | 707/102 |
| 2002/0056010 A1 | | 5/2002 | Lincoln et al. | |
| 2002/0059463 A1 | | 5/2002 | Goldstein | |
| 2003/0090398 A1 | * | 5/2003 | Rijavec | 341/55 |
| 2003/0110296 A1 | * | 6/2003 | Kirsch et al. | 709/246 |
| 2003/0115042 A1 | * | 6/2003 | Chen et al. | 704/200.1 |
| 2004/0064588 A1 | | 4/2004 | Jungck | |
| 2006/0251330 A1 | * | 11/2006 | Toth et al. | 382/236 |

OTHER PUBLICATIONS

International Search Report for International Application No. PCT/US2005/08077, mailed Jul. 22, 2005.
Written Opinion of the International Searching Authority for International Application No. PCT/US2005/08077, mailed Jul. 22, 2005.
International Preliminary Report on Patentability corresponding to International Application No. PCT/US2005/008077, mailed Sep. 20, 2007, 4 pages.

* cited by examiner

*Primary Examiner*—Tim T. Vo
*Assistant Examiner*—Jau-Shya Meng
(74) *Attorney, Agent, or Firm*—Hanley, Flight & Zimmerman, LLC

(57) ABSTRACT

Methods and apparatus to compress a dataset include: obtaining a first block of a dataset to be compressed; computing a proxy for at least a portion of the first block; comparing the proxy to a set of proxies representative of previously stored blocks; and, if the proxy for the at least the portion of the first block matches a proxy in the set of proxies, storing a data structure that maps the at least the portion of the first block to at least a portion of a previously stored block associated with the matching proxy without storing the at least the portion of the first block.

12 Claims, 8 Drawing Sheets

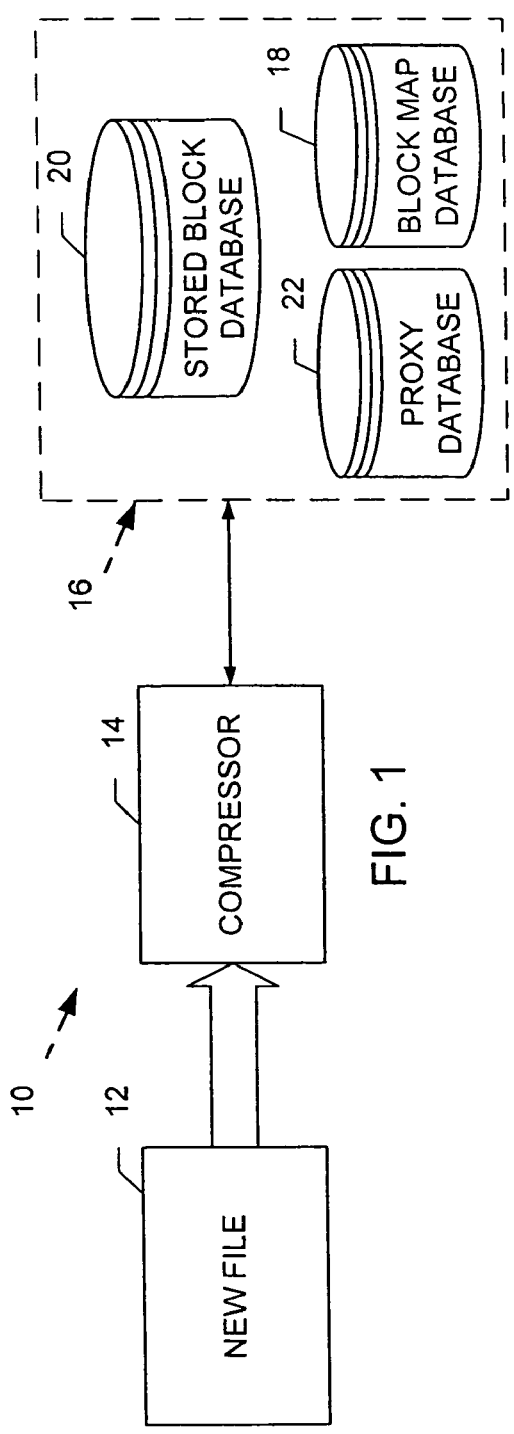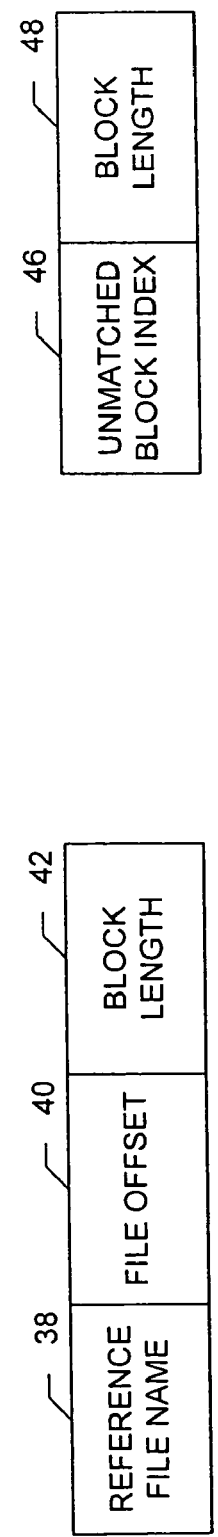

METHODS AND APPARATUS TO COMPRESS DATASETS USING PROXIES

FIELD OF THE DISCLOSURE

This disclosure relates generally to data compression, and, more particularly, to methods and apparatus to compress datasets.

BACKGROUND

As computers have become more and more ubiquitous, the amount of computer readable data has dramatically increased. For instance, businesses and individuals create countless word processing documents (e.g., documents created using Microsoft's Word™), spreadsheets (e.g., documents created using Microsoft's Excel™), slide presentations (e.g., documents created using Microsoft's Power Point™) and other files on a daily basis. The volume of computer accessible files has further increased as a result of the proliferation of electronic mail as a communication vehicle of choice in both the business and personal contexts.

Individuals and businesses frequently want to store the data and files they create. Such data and files are often stored so that they can be re-used or re-purposed, or to create a historical record of activities and communications. Given the prolific creation of electronic data and the desire to retain such data for possible future use, the demand for electronic storage space has steadily increased. Various types of storage mediums from floppy and hard disk drives, to flash memory devices, to optical storage devices such as DVD (digital versatile disk) devices and compact disc devices have been developed to meet this demand.

At the same time that the types and volumes of storage mediums have multiplied, file compression solutions seeking to store datasets more efficiently have been developed. File compression techniques have the same basic goal, namely, reducing the size of a dataset to reduce storage space or transmission time. Compression techniques may achieve these goals by, for example, replacing a series of repeating characters in a dataset to be compressed with a shorter code representing the same, using codes to represent frequently recurring objects or strings in the dataset, and/or removing unnecessary text such as extra spaces from the dataset. Compression techniques can be lossy or lossless. As the name suggests, lossy compression techniques lose some of the original data from the compressed dataset such that the dataset reconstructed from a compressed dataset is not exactly the same as the original dataset before compression. Similarly, lossless compression techniques are able to restore all of the data originally present in a dataset after the dataset has been compressed and reconstructed.

Many applications are provided with functionality for compressing datasets. For example, Microsoft's Outlook™ product is provided with an archiving tool to compress email messages into a compressed archive file. Other known data compressors include RAR and WinZip™.

The LZW compression technique is one well known algorithm for compressing a file. The LZW technique, (which is named for its developers Lempel, Ziv and Welch), breaks a dataset to be compressed into non-overlapping sequential blocks of bits. These blocks of bits are used to sequentially populate a table wherein a unique code is assigned to each block of bits entered in the table. The codes are shorter than the length of the block of bits to which they are assigned. When the LZW algorithm reaches a block of bits in the file, it compares the block of bits to the blocks of bits already written in the table and, thus already appearing in the compressed dataset being created. If the block does not already exist in the table, it is added to the table and assigned a unique code. It is also written into the compressed dataset. If, on the other hand, the block already exists in the table, the duplicate block of bits is not written to the compressed dataset. Instead, the corresponding code from the table is written to the compressed dataset in place of the duplicate block of bits, thereby shortening the dataset. After the entire dataset has been processed in this fashion, the table is appended to the compressed dataset.

BRIEF DESCRIPTION OF THE DRAWINGS

FIG. 1 is a schematic illustration of an example apparatus constructed in accordance with the teachings of the invention to compress datasets.

FIG. 3 is a diagram illustrating an example data structure for a matched block.

FIG. 4 is a diagram illustrating an example data structure for an unmatched block.

DETAILED DESCRIPTION

Figure 2:
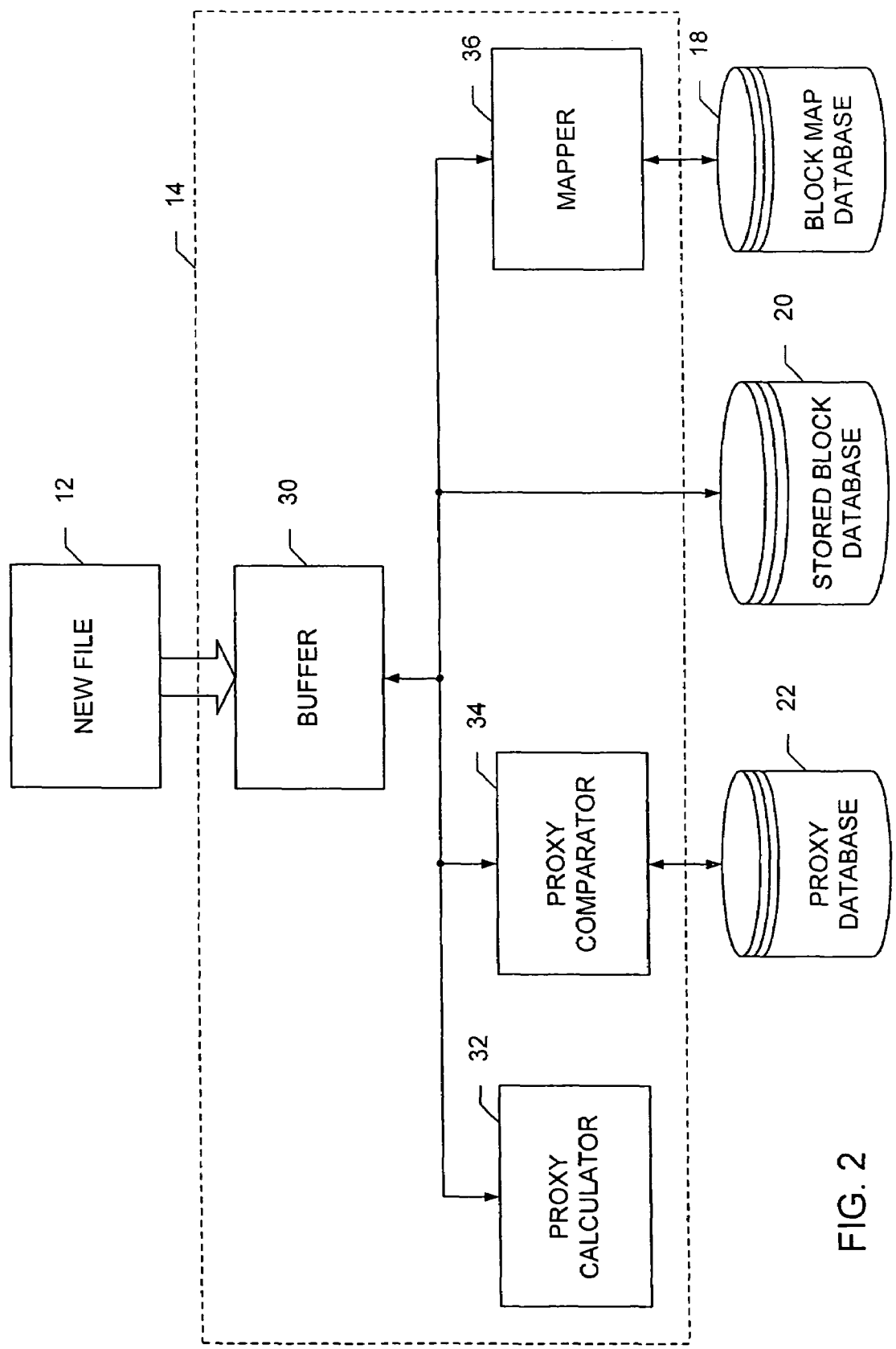
FIG. 2 is a more detailed schematic illustration of the example apparatus of FIG. 1.

FIG. 1 is a schematic illustration of an example apparatus 10 to compress and store a dataset 12. In the illustrated example, the apparatus 10 includes a compressor 14 and a database 16. As explained in detail below, to compress and store the dataset 12, not only does the compressor 14 examine the dataset 12 for redundant blocks of data within itself (i.e., two or more duplicate copies of a block of bits within the dataset 12), but the compressor 14 also accesses the database 16 to search for redundancies between the dataset 12 to be stored and the datasets previously stored in the database 16. Any redundant blocks found in the new dataset 12 by the compressor 14 are not added to the database 16. Instead, the compressor 14 writes a data structure in a block map 18 which contains metadata reflecting how to reconstruct the original dataset 12 from the compressed dataset. In particular, the metadata in the stored data structures shows how to reconstruct the dataset 12 using the blocks of the new dataset 12 stored in the database 16 and using previously stored blocks from other dataset and/or duplicated blocks from the new dataset 12 that had earlier been stored in the process of compressing the dataset 12. Preferably, the apparatus 10 compresses the dataset in a lossless manner such that the original dataset 12 may be reconstructed from the compressed dataset without any loss of data.

Throughout this patent, the term "dataset" refers to any set of computer readable data. Thus, a dataset may be a computer accessible file such as a word processing document, a presentation slide, an email message, a spreadsheet, etc, and/or a dataset may be a set of raw data such as the byte data in a hard drive.

Although the database 16 may be implemented by a single database located in a single location (e.g., on a single storage device) or distributed across multiple locations (e.g., on multiple storage devices located in the same or different geographical locations), it may also be implemented by multiple databases, again located in a single location (e.g., on a single storage device) or distributed across multiple locations (e.g., on multiple storage devices located in the same or different geographical locations). In the illustrated example, the database 16 includes a stored block database 20 and the block map 18. As explained in detail below, the datasets stored in the database 16 are partitioned into blocks of data and stored in the block database 20. The block map 18 stores metadata concerning the blocks stored in the block database 20 and how those blocks are used to reconstruct the dataset(s) they represent. Thus, for example, the block map 18 maps a redundant block of a stored dataset to a block previously stored in the block database 20.

The compressor 14 compresses a new dataset 12 and adds it to the database 16 by sequentially comparing blocks of the new dataset 12 to blocks already stored in the stored blocks database 20. New blocks from the dataset 12 that do not match any block already stored in the block database 20 are added to the stored block database 20. Blocks in the new dataset 12 that duplicate a block already stored in the stored block database 20 are not added to the block database 20, but instead a data structure is added to the map database 18 mapping the redundant block from the new dataset 12 to the corresponding block which is already present in the stored block database 20. As a result, the amount of data required to store the new dataset 12 in the database 16 is reduced as a function of the number of redundant blocks that are identified in the dataset 12 as compared to itself and to previously stored dataset. As databases often contain datasets of a same general type, the datasets in such a database will typically include many duplicate blocks of data (e.g., an archive of Power Point™ files would tend to have many similar blocks of code used to reflect common structures in presentations). Consequently, the example apparatus 10 of FIG. 1 can achieve particularly good compression in operating on databases containing the same general type of datasets (e.g., an archive of email files), although it is not limited to use with such databases.

The block database 20 may be quite large, depending on the number of datasets stored. Therefore, in order to facilitate efficient storage and compression of new datasets 12, the database 16 is further provided with a proxy database 22. The proxy database 22 stores a list of codes representative of the content of the blocks stored in the block database 20. Thus, rather than comparing the actual blocks of the new dataset 12 to the actual blocks previously stored in the stored database 20, the compressor 14 compares proxies representative of the blocks of the new dataset 12 to proxies for the blocks already stored in the stored block database 20.

Any number of various techniques may be employed to generate proxies for the blocks. In the illustrated example, a technique that generates a proxy that is uniquely representative of the content of the corresponding block, but is much shorter than the corresponding block is preferably employed. This approach enables fast and efficient searching for redundant blocks across a plurality of datasets stored in database. In other words, it enables the apparatus 10 to quickly compress the new dataset 12 using the information in a plurality of previously stored datasets by identifying redundancies between the new dataset and itself as well as between the new dataset 12 and the previously stored datasets.

A more detailed illustration of an example compressor 14 is shown in FIG. 2. In the illustrated example, the compressor 14 is provided with a buffer 30 to store blocks of data of the new dataset 12 being compressed. The buffer 30 stores N bytes of data of the new dataset 12. Persons of ordinary skill in the art will readily appreciate that a buffer of any desired size may be employed.

In order to calculate a proxy for a block of data from the dataset to be compressed, the compressor 14 is further provided with a proxy calculator 32. As mentioned above, the proxy calculator 32 may implement any desired algorithm to generate a code representative of a block stored in the buffer 30. In the illustrated example, the proxy calculator 32 employs the SHA1 hash function to generate proxies. For a storage device of a given capacity, the likelihood that two different blocks will have the same hash value, (i.e., that a collision will occur), can be determined. If the probability of a collision is sufficiently small, we can be confident that each calculated hash is unique.

Persons of ordinary skill in the art will appreciate that it may be possible to match blocks of different lengths. For example, it may be that a block of data of a first length is not matchable with any block in the block database 20, but that one or more portions of that block are matchable with a block or one or more portions of a block stored in the block database 20. In other words, it is possible that different sized blocks of data may be duplicated in a dataset or group of datasets.

To address such a possibility, in the illustrated example, the proxy calculator 32 operates on a given block of the data stored in the buffer 30, and on several smaller portions of that same block of data to calculate multiple proxies for the same block of data. In particular, the proxy calculator 32 calculates one proxy for a full block of data stored in the buffer 30 (e.g., for a block of 4 KB of the data stored in the buffer 30). it also calculates a proxy for the first half of that full block of data (i.e., for the first 2 KB of the full block of data) and a proxy for the second half of the full block of data (i.e., for the second 2 KB of data in the full block). The proxy calculator 32 of the illustrated example also calculates a proxy for the first quarter of the full block of data (i.e., for the first 1 KB of the full block), a proxy for the second quarter of the full block (i.e., for the second 1 KB of full block), a proxy for the third quarter of the full block of data (i.e., for the third 1 KB of the full block), and a proxy for the fourth quarter of the full block of data (i.e., for the fourth 1 KB of the full block). Calculating these seven different proxies for the same set of data (e.g., for one block of data and subsets of that block) enables searching of the database 16 for matches of three different block sizes (e.g., 4 KB, 2 KB, and 1 KB blocks). To facilitate such searching, the proxy database 22 may be grouped into multiple lists of proxies. For example, the proxy database 22 of the illustrated example includes a list of 4 Kb proxies, a list of 2 Kb proxies and a list of 1 Kb proxies.

For the purpose of determining whether a given block of data (which may be a full block or a portion of a full block) matches a block of data or a portion of a block of data already stored in the stored block database 20, the compressor 14 is further provided with a proxy comparator 34. The proxy comparator 34 compares one or more of the proxies calculated by the proxy calculator 32 with one or more proxies appearing in the appropriate proxy list to determine whether or not the block(s) of bits corresponding to the proxies match any block (or portion of a block) already stored in the stored block database 20. As discussed above, because each proxy is unique to the block for which it is calculated, matching proxies are indicative that the underlying blocks from which the matching proxies were calculated are exact duplicates of one another. Because the proxies are much shorter than the blocks they represent, the proxy comparator 34 can compare the proxies much more quickly then could be achieved by directly comparing the underlying blocks of bits. Therefore, the proxy calculator 34 can quickly find matches between blocks to be stored and blocks already stored in the stored block database 20, even when the stored block database 20 becomes large. Any known search technique (e.g., balance binary tree, hash table, etc.) can be used to look for matching proxies in the proxy database 22.

In order to enable reconstruction of the compressed dataset from the blocks stored in the stored block database 20, the compressor 14 is further provided with a mapper 36. The mapper 36 creates and stores unmatched block data structures corresponding to blocks added to the stored block database 20 and matched block data structures corresponding to blocks that are not added to the stored block database 20 because a duplicate of that block already exists in the stored block database 20.

An example matched block data structure for a block that is not added to the stored block database 20 is shown in FIG. 3. The example matched block data structure is used for a block that is a duplicate of a block already stored in the stored block database 20 and, thus, is not again added to the database 20. As shown in FIG. 3, the example matched block data structure includes a reference file name field 38, a file offset field 40 and a block length field 42. The reference file name field 38 stores data identifying the matching block stored in the database 20 that should be used to recreate the block associated with the matched block data structure when de-compressing the dataset. The file offset field 40 identifies the start of the portion of the matching block stored in the database 20 that should be used to recreate the block associated with the matched block data structure when de-compressing the dataset. The block length field 42 identifies the length of the portion of the matching block stored in the database 20 that should be used to recreate the block associated with the matched block data structure when de-compressing the dataset.

An example unmatched block data structure is shown in FIG. 4. The unmatched block data structure is used for a block that is added to the stored block database 20. As shown in FIG. 4, the example unmatched block data structure includes an unmatched block index field 46 and a block length field 48. The unmatched block index field 46 stores a unique identifier identifying the stored block. This identifier may be used, for example, in the reference file name field 38 of the matched block data structure for an un-stored block that matches the stored block corresponding to the unmatched block data structure of FIG. 4. The block length field 48 stores data indicative of the length of the block corresponding to the unmatched block data structure of FIG. 4.

To reduce the amount of data required in the block map database 18, it is desirable to match the largest possible blocks of data whenever possible. Thus, for example, if it is possible to match a full block of data, it would also be possible to match the first half block of data and the second half block of data with corresponding halves of a block of data in the stored block database 20. However, employing the matching half-blocks will require more data in the block map 18 then employing the matching full block and, thus, is not consistent with the goal of compressing the dataset 12 as much as possible without loss of data. Accordingly, the proxy comparator 34 preferably first seeks to match the proxy corresponding to the full block. The proxy comparator 34 only seeks to match the proxies for the half-blocks corresponding to the full block if there is no match of the full block. Similarly, the proxy comparator 34 only seeks to match the proxies for the quarter-blocks if the corresponding half block(s) are not matched.

Persons of ordinary skill in the art will readily appreciate that the manner in which data in the buffer 30 is grouped into blocks can effect whether a match is found. For example, if the data in the buffer 30 is simply grouped into a plurality of non-overlapping sequential blocks, it is possible that a sequence of data which matches a block of data already stored in the stored block database 20 will not be grouped as a block, but instead, will overlie two sequential blocks defined in the data, and, thus, will not be found. To avoid such a result, the proxy calculator 32 of the illustrated example employs a sliding window approach to selecting blocks.

Figure 5:
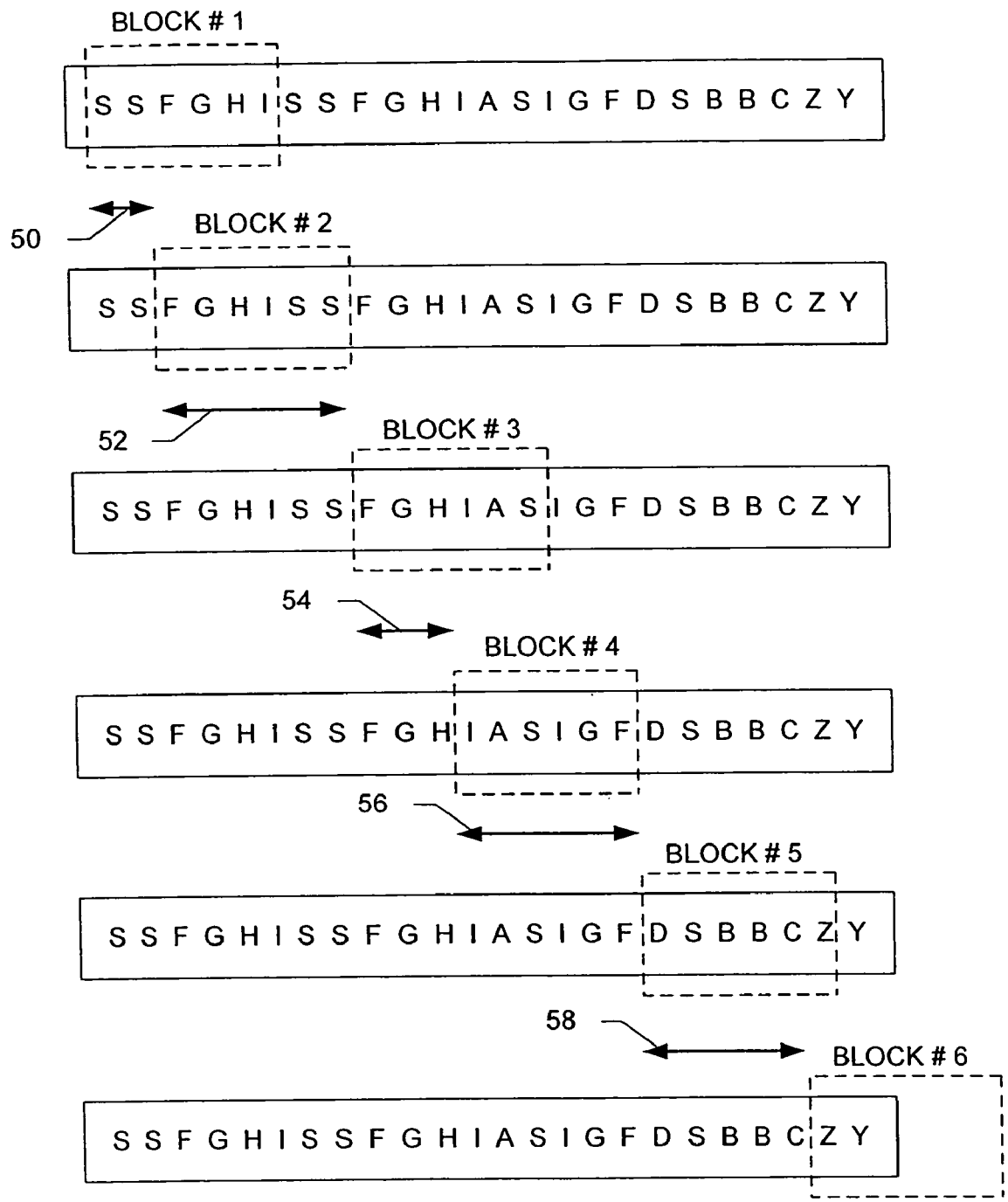
FIG. 5 is a diagram illustrating sliding a block window to define blocks in a dataset to be compressed.

In particular, as shown in FIG. 5, the first block in a file 12 begins with and includes the first bit in the dataset 12 and has a predetermined length. In the illustrated example, Block #1 is 4 Kb long. The 4 Kb of data in Block #1 is represented by the symbols "S S F G H I." Thus, the proxy calculator 32 calculates the proxies for Block #1 (i.e., the proxy for all of the data in Block #1, the proxy for the first half of Block #1, the proxy for the second half of Block #1, the proxy for the first quarter of Block #1, the proxy for the second quarter of Block #1, the proxy for the third proxy of Block #1, and the proxy for the fourth quarter of Block #1) and stores those proxies in the proxy database 22. In the example of FIG. 5, it is assumed that the proxy comparator 34 does not find a match between any of the proxies of Block #1 and the proxy of any of the blocks stored in the stored block database 20. Therefore, Block #1 is stored in the stored block database 20, an unmatched block data structure (see, for example, FIG. 4) is added to the block map database 18, and the proxy calculator 32 slides the block window by a predetermined unmatched slide amount 50.

A new block (i.e., Block #2) is identified by the new position of the block window. As shown in FIG. 5, the unmatched slide amount 50 is selected such that Block #2 partially overlaps with Block #1. Thus, in the illustrated example, the 4 Kb of data in Block #2 is represented by the symbols "F G H I S S," wherein the first 4 symbols "F G H I" represent data common to both Block #1 and Block #2, and the symbols "S S" represent data that is in Block #2, but not in Block #1. Defining the block following a completely unmatched block such as Block #1 to overlap with the unmatched block reduces the chance that matches between blocks in the new dataset 12 and blocks in the stored block database 20 are missed due to block mis-alignment.

With Block #2 defined, the proxy calculator 32 calculates the proxies for Block #2 and the proxy comparator 34 compares one or more of the proxies to the proxies stored in the proxy database 22. In the example of FIG. 5, it is assumed that the proxy comparator 34 finds a match between the proxy for the full Block #2 and a proxy of a block stored in the stored block database 20. Therefore, the half and quarter proxies for Block #2 are not checked for matches, Block #2 is not stored in the stored block database 20, a matched block data structure (see, for example, FIG. 3) is added to the block map database 18, and the proxy calculator 32 slides the block window by a predetermined full block matched slide amount 52.

A new block (i.e., Block #3) is identified by the new position of the block window. As shown in FIG. 5, the full block matched slide amount is selected such that the newly defined block (i.e., Block #3) does not overlap with the matched block (i.e., Block #2). The new block is selected to not overlap with the previous block because the previous block experienced maximum compression and, thus, there is no need to examine it for further compression possibilities. In other words, the previous block was fully matched by an already stored block, so none of the data of the previous block is added to the stored block database 20. Accordingly, the search for blocks to compress advances to the sequential block of data (i.e., Block #3) immediately following the fully matched block (i.e., Block #2).

With Block #3 defined, the proxy calculator 32 calculates the proxies for Block #3 and the proxy comparator 34 compares one or more of the proxies to the proxies stored in the proxy database 22. In example of FIG. 5, it is assumed that the proxy comparator 34 does not find a match between the proxy for the full Block #3 and the proxy of any block stored in the stored block database 20. However, the proxy comparator 34 does find a match between the proxy for the first half of Block #3 and the proxy for a half (which may be a first half or a second half) of a block stored in the stored block database 20. It is also assumed that the quarter proxies for the third and fourth quarters of Block #3 are not matched by any quarter proxies in the proxy database 22 (i.e., the third and fourth quarter of Block #3 are not matched by a portion of a stored block). Therefore, Block #3 is not stored in the stored block database 20, a matched block data structure (see, for example, FIG. 3) is added to the block map database 18 mapping the first half of Block #3 to a matching portion of a previously stored block, and the proxy calculator 32 slides the block window by a predetermined first half block matched slide amount 54.

A new block (i.e., Block #4) is identified by the new position of the block window. As shown in FIG. 5, the first half block matched slide amount is selected such that the newly defined block (i.e., Block #4) does not overlap with the matched portion of the previous block (i.e., the first half of Block #3), but does overlap with the non-matched portion of the previous block (i.e., the second half of Block #3). The new block (i.e., Block #4) is selected to not overlap with the matched portion of the previous block (i.e., Block #3) because the matched portion of the previous block experienced maximum compression and, thus, there is no need to examine it for further compression possibilities. In other words, the matched portion of the previous block was fully matched by an already stored block, so none of the data of the matched portion of the previous block is added to the stored block database 20. Instead, the matched portion of the previous block is identified in the database by creating a matched block data structure (see, for example, FIG. 3) referencing the matching block already stored in the database 20, the start bit of the matching portion in the referenced block (e.g., an offset from the start of the referenced block), and the length of the matched block (e.g., one half block such as 2 Kb). The search for blocks to compress then advances to the sequential block of data (i.e., Block #4) immediately following the matched portion of the previous block (i.e., to the data beginning after the first half of Block #3).

With Block #4 defined, the proxy calculator 32 calculates the proxies for Block #4 and the proxy comparator 34 compares one or more of the proxies to the proxies stored in the proxy database 22. In example of FIG. 5, it is assumed that the proxy comparator 34 does not find a match between the proxy for the full Block #4 and the proxy of any block stored in the stored block database 20. It is also assumed that the proxy calculator does not find a match between the first half proxy of Block #4 and the proxy of any block stored in the stored block database 20, or between the first and second quarter proxies of Block #4 and the proxy of any block stored in the stored block database 20. However, the proxy comparator 34 does find a match between the proxy for the second half of Block #4 and the proxy for a half (which may be a first half or a second half) of a block stored in the stored block database 20. Therefore, the first half of Block #4 is stored in the stored block database 20, an unmatched block data structure (see, for example, FIG. 4) is added to the block map database 18 identifying the presence of the newly stored block corresponding to the first half of Block #4, a matched block data structure (see, for example, FIG. 3) is added to the block map database 18 mapping the second half of Block #4 to a portion of a previously stored block, and the proxy calculator 32 slides the block window by a predetermined second half block matched slide amount 56.

A new block (i.e., Block #5) is identified by the new position of the block window. As shown in FIG. 5, the second half block matched slide amount is selected such that the newly defined block (i.e., Block #5) does not overlap with any portion of the previous block (i.e., Block #4) because the last portion of the previous block was a matched portion. As discussed above, matched portions are not overlapped in creating subsequent blocks because the matched portion has already experienced maximum compression. The search for blocks to compress thus advances to the next sequential block of data (i.e., Block #4) that might be available for compression, namely, the data immediately following the matched portion of the previous block (e.g., to the data beginning after Block #4).

With Block #5 defined, the proxy calculator 32 calculates the proxies for Block #5 and the proxy comparator 34 compares one or more of the proxies to the proxies stored in the proxy database 22. In example of FIG. 5, it is assumed that the proxy comparator 34 does not find a match between the proxy for the full Block #5 and the proxy of any block stored in the stored block database 20. It is also assumed that the proxy calculator 34 does not find a match between the first half proxy of Block #5 and the proxy of any block stored in the stored block database 20, between the second half proxy of Block #5 and the proxy of any block stored in the stored database 20, between the fourth quarter proxy of Block #5 and the proxy of any block stored in the stored block database 20, or between the first and second quarter proxies of Block #5 and the proxy of any block stored in the stored block database 20. However, the proxy comparator 34 does find a match between the proxy for the third quarter proxy of Block #5 and the proxy of a quarter (which may be any quarter) of a block stored in the stored block database 20. Therefore, the first half of Block #5 is stored in the stored block database 20, an unmatched block data structure (see, for example, FIG. 4) is added to the block map database 18 identifying the presence of the newly stored block corresponding to the first half of Block #5, a matched block data structure (see, for example, FIG. 3) is added to the block map database 18 mapping the third quarter of Block #5 to a portion of a previously stored block, and the proxy calculator 32 slides the block window by a predetermined third quarter block matched slide amount 58.

A new block (i.e., Block #6) is identified by the new position of the block window. As shown in FIG. 5, the third quarter block matched slide amount is selected such that the newly defined block (i.e., Block #6) begins immediately after the third quarter of the previous block (i.e., Block #5) and, thus, overlaps with the fourth quarter of the previous block because the third quarter of the previous block (i.e., Block #5) was a matched portion. As discussed above, matched portions are not overlapped in creating subsequent blocks because the matched portion has already experienced maximum compression. The search for blocks to compress thus advances to the next sequential block of data (i.e., Block #6) that might be available for compression, namely, the data immediately following the last matched portion of the previous block.

Although not shown in FIG. 5, from the foregoing, persons of ordinary skill in the art will appreciate that, when the proxy comparator 34 finds a match between the second quarter and no other portion of a block, the proxy calculator 32 slides the block window by the predetermined first half block matched slide amount 54 to ensure the next block does not overlap with the matched portion of the previous block. Similarly, when the proxy comparator 34 finds a match between the fourth quarter and no other portion of a block, the proxy calculator 32 slides the block window by the predetermined full block matched slide amount 54 to ensure the next block does not overlap with the matched portion of the previous block. Persons of ordinary skill in the art will also appreciate that, when the proxy comparator 34 finds a match between the first quarter and no other portion of a block, the proxy calculator 32 slides the block window by a predetermined first quarter block matched slide amount such that the next block overlaps with the last three-quarters of the previous block and the next block does not overlap with the matched portion of the previous block.

The compressor 14 continues to analyze the new dataset 12 on a sequential block by block basis until all of the data of the new dataset 12 has been reviewed for duplication against previously stored blocks in the database 20 (which may come from an earlier portion of the new dataset 12 or from a completely different dataset altogether). Once the entire new dataset 12 has been analyzed and compressed, the compressor 14 moves on to the next new dataset to be compressed or, if all desired datasets have been compressed, terminates the process until another new dataset is identified for compression.

To evidence the fact that the compression performed by the apparatus 10 is lossless, it may be desirable to compute a hash function for the new dataset 12 before the apparatus 10 compresses the same. This hash value can be stored in association with the compressed version of the new dataset 12. Then, when the dataset 12 is reconstructed from the compressed dataset, the hash function of the reconstructed dataset can be computed and compared to the hash function previously stored for the new dataset. If the hash functions match (as they should), the reconstructed dataset is an exact duplicate of the new dataset 12 prior to compression.

Figure 6:
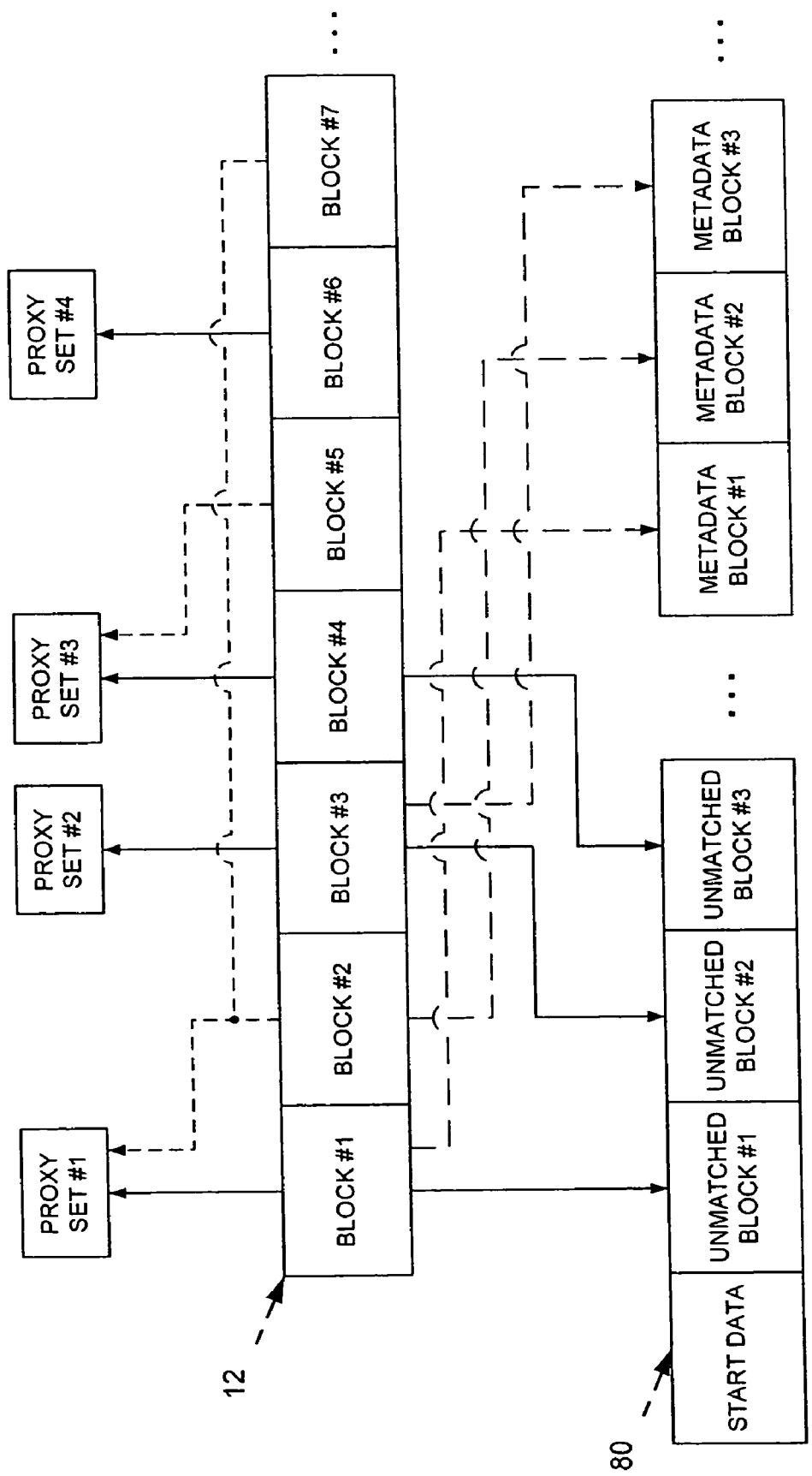
FIG. 6 is a schematic diagram illustrating an example dataset being compressed into a compressed file.

The manner in which a new dataset 12 is compressed by the example apparatus 10 is further illustrated in FIG. 6. In the example of FIG. 6, a new dataset 12 is compressed into a compressed dataset 80. The new dataset 12 is represented in FIG. 6 by a sequential series of blocks (e.g., Blocks #1-7). From the foregoing, persons of ordinary skill in the art will readily appreciate that the blocks (e.g., Blocks #1-7) may represent overlapping or non-overlapping portions of the actual data of the new dataset 12. Also, in the example of FIG. 6, the unmatched blocks appearing at the front of the compressed dataset 80 are the blocks stored in the stored blocks database 20 from the new dataset 12, and the metadata blocks appearing at the end of the compressed dataset 80 are matched block and/or unmatched block data structures such as those shown in FIGS. 3 and 4 above. Those matched block and/or unmatched block data structures are created and populated by the mapper 36 to provide a map for reconstructing the dataset 12 from the compressed dataset. The metadata blocks are, thus, the data structures discussed above as stored in the block map 18.

In the example of FIG. 6, none of the proxies of Block #1 (i.e., Proxy Set #1) are present in the stored block database 20. Accordingly, Block #1 is copied to the stored block database 20 as Unmatched Block #1. Also, the mapper 36 creates an unmatched block data structure (see, for example, FIG. 4) assigning an index to Block #1 as stored in the database 20 (i.e., to Unmatched Block #1) and identifying the length of Unmatched Block #1/Block #1. Further, the proxies of Block #1 (i.e., Proxy Set #1) are added to the proxy database 22 to enable matching of subsequent blocks or portions thereof to Unmatched Block #1 or portions thereof.

In the example of FIG. 6, the full proxy of Block #2 matches the full proxy of Unmatched Block #1 (i.e., Block #1 of the new dataset 12). Accordingly, Block #2 is not added to the stored block database 20 (i.e., a copy of Block #2 does not appear in the compressed dataset 80). Instead, the mapper 36 adds Metadata Block #2 for Block #2 to the compressed dataset. Metadata Block #2 is a matched block data structure such as the example data structure appearing in FIG. 3 indicating that Block #2 can be reconstructed by duplicating the entire Unmatched Block #1. Thus, Metadata Block #2 identifies Unmatched Block #1, indicates that the duplication of Unmatched Block #1 to create Block #2 should begin with the first bit of Unmatched Block #1 (i.e., no offset), and indicates the length of Block #2 (i.e., how much of Unmatched Block #1 is used to re-create Block #2).

In the example of FIG. 6, none of the proxies of Block #3 (i.e., Proxy Set #3) are present in the stored block database 20. Accordingly, Block #3 is copied to the stored block database as Unmatched Block #2. Also, the mapper 36 creates an unmatched block data structure (see, for example, FIG. 4) assigning an index to Block #3 as stored in the database 20 (i.e., to Unmatched Block #2) and identifying the length of Unmatched Block #2/Block #3. Further, the proxies of Block #3 (i.e., Proxy Set #3) are added to the proxy database 22 to enable matching of subsequent blocks or portions thereof to Unmatched Block #2 or portions thereof.

The remaining blocks of the new dataset 12 of FIG. 6 are treated as explained above, namely, by adding Unmatched Blocks to the compressed dataset 80 for blocks or portions of blocks where no matching block or portion of a block is already present in the database 20 (see, for example, Block #4 and Block #6), and adding Metadata Blocks to the compressed dataset 80 providing a map of how to reconstruct the dataset 12 from the compressed dataset 80.

Persons of ordinary skill in the art will appreciate that, although the above description refers to storing unmatched blocks or block portions in the block database 20, the unmatched blocks or unmatched block portions may be compressed using any known compression algorithm prior to storage in the block database 20. For example, unmatched blocks and/or unmatched block portions may be compressed using a lossless compression technique such as the LZW algorithm in order to reduce the size of the compressed dataset(s) and the size of the block database 20.

Figure 7A:
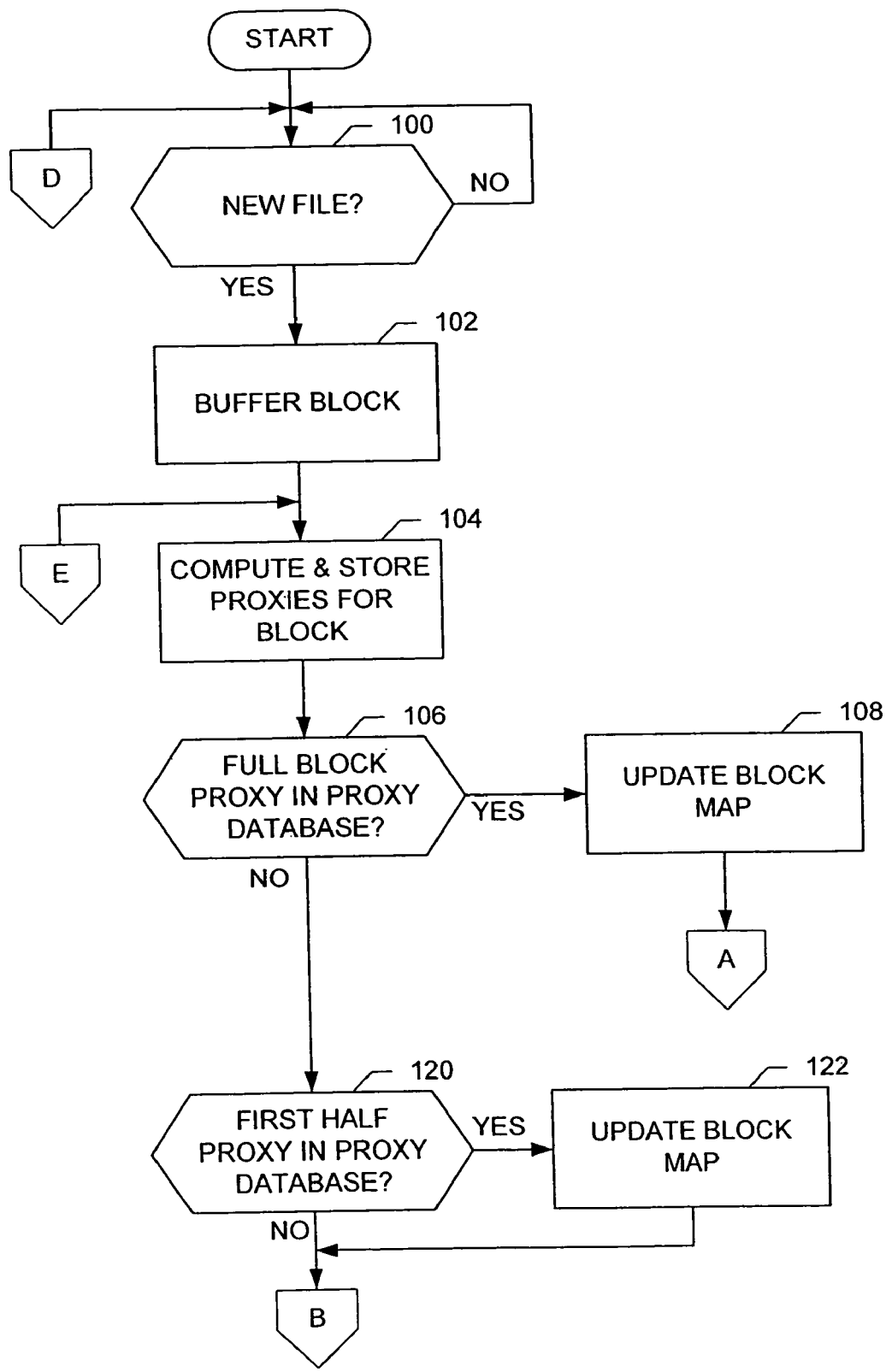
FIGS. 7A-7C are flowcharts representative of example machine readable instructions that may be executed by a machine to implement the apparatus of FIGS. 1 and 2.
Figure 7B:
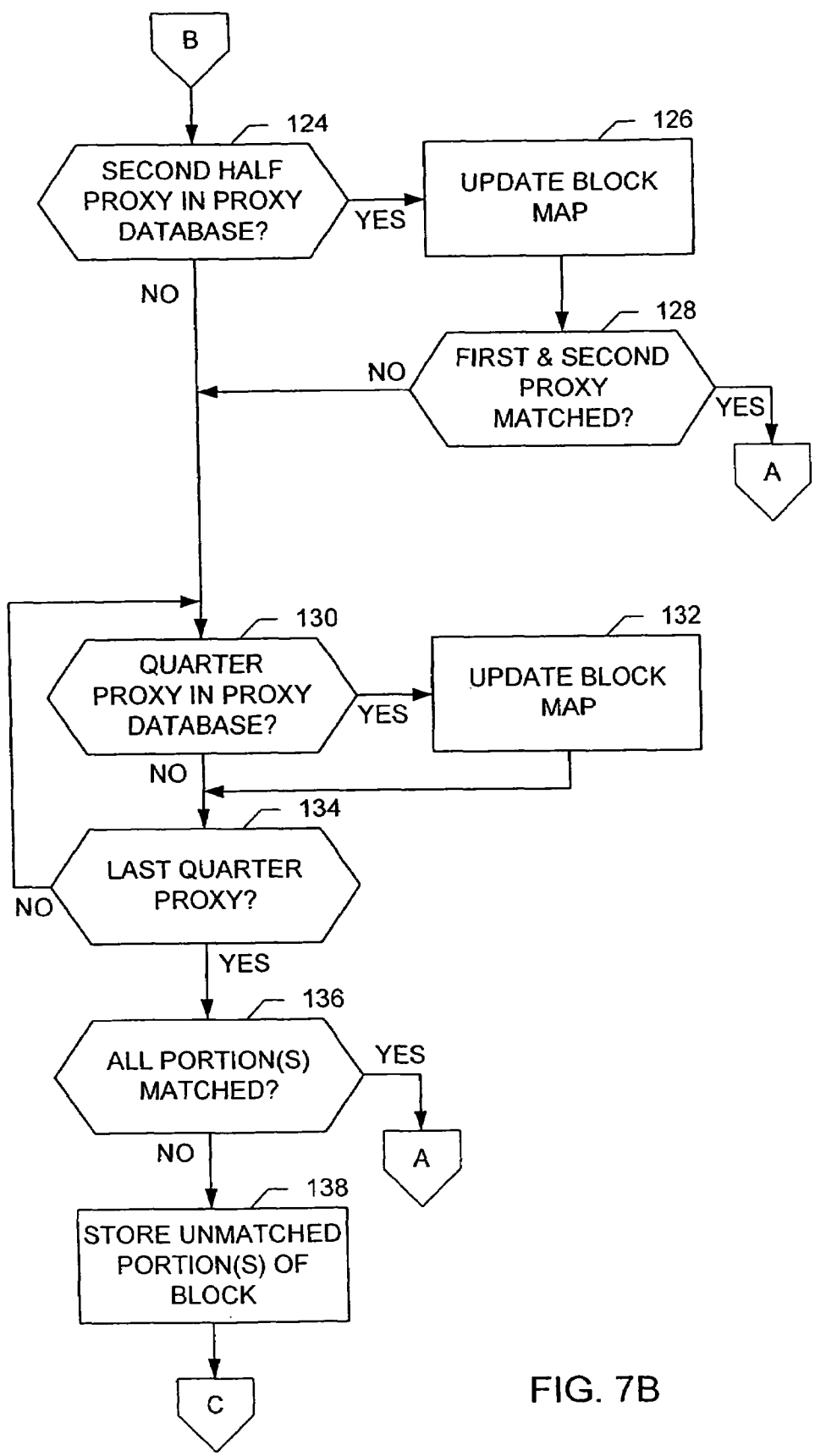
Figure 7C:
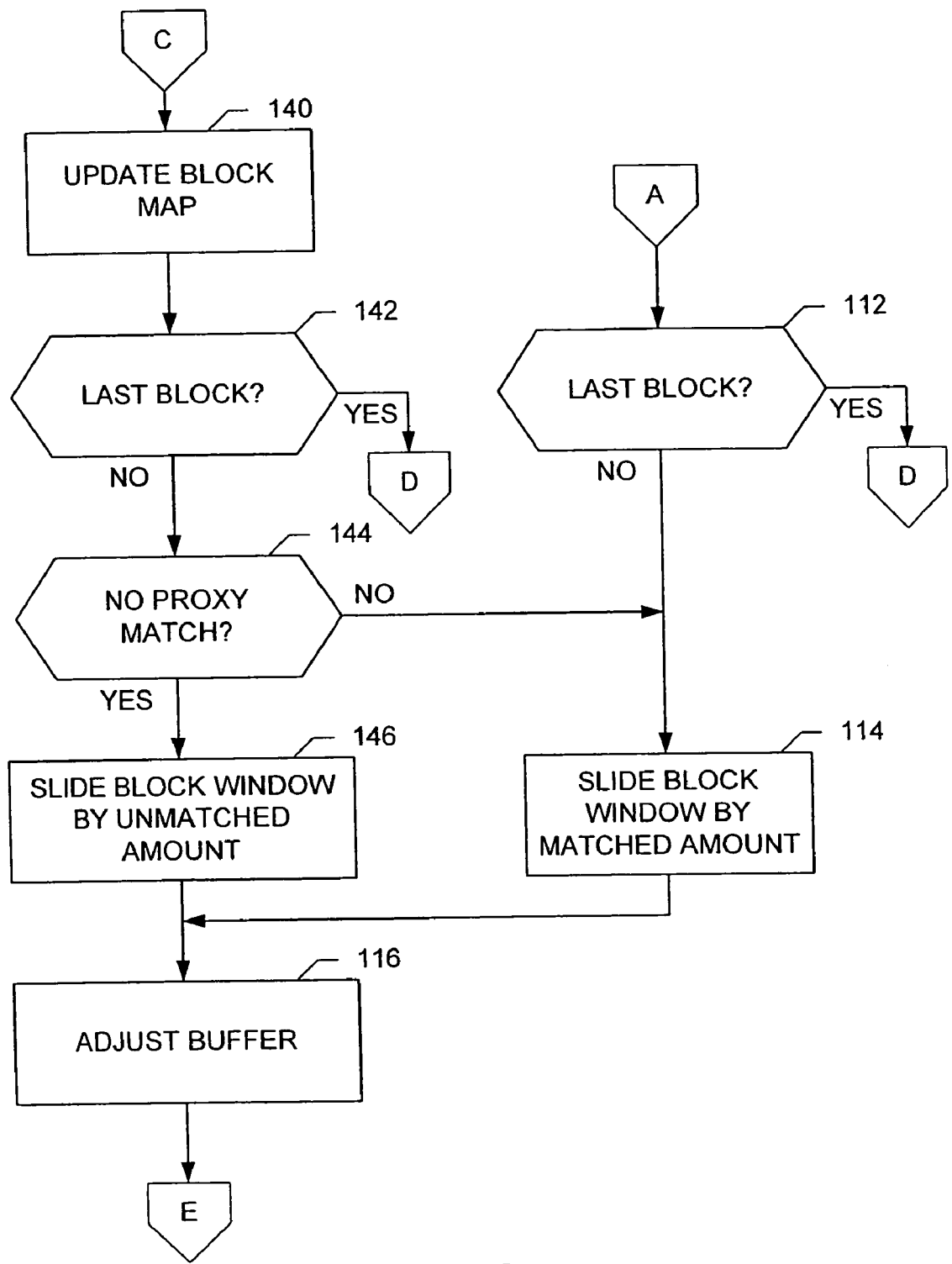

A flowchart representative of example machine readable instructions for implementing the apparatus 10 of FIG. 1 is shown in FIGS. 7A-7C. In this example, the machine readable instructions comprise a program for execution by a processor such as the processor 1012 shown in the example computer 1000 discussed below in connection with FIG. 8. The program may be embodied in software stored on a tangible medium such as a CD-ROM, a floppy disk, a hard drive, a digital versatile disk (DVD), or a memory associated with the processor 1012, but persons of ordinary skill in the art will readily appreciate that the entire program and/or parts thereof could alternatively be executed by a device other than the processor 1012 and/or embodied in firmware or dedicated hardware in a well known manner. For example, any or all of the compressor 14, the proxy calculator 32, the proxy comparator 34, and/or the mapper 36 could be implemented by software, hardware, and/or firmware. Further, although the example program is described with reference to the flowchart illustrated in FIGS. 7A-7C, persons of ordinary skill in the art will readily appreciate that many other methods of implementing the example apparatus 10 may alternatively be used. For example, the order of execution of the blocks may be changed, and/or some of the blocks described may be changed, eliminated, or combined.

The program of FIG. 7A begins at block 100 where the compressor 14 awaits an instruction to compress a new dataset 12. When a new dataset is identified for compression, control advances to block 102.

At block 102, a first portion of the new dataset 12 is written to the buffer 30 for processing. The proxy calculator 32 then calculates all of the proxies for the first block (e.g., Block #1 in FIG. 6) in the buffer 30 and stored the proxies in the proxy database 22 (block 104). As discussed above, any desired proxy calculation method may be employed by the proxy calculator 32.

Once the proxies for the block in question are calculated and stored (block 104), the proxy comparator 34 compares the full proxy for the block in question to the list of full proxies stored in the proxy database 22 (block 106). If the full proxy for the block in question is already present in the list (block 106), the entire block can be compressed and control advances to block 108. Otherwise, the full block is not duplicated in the stored block database 20 and control advances to block 120.

If the full proxy of the block in question is present in the proxy database 22, control advances to block 108 where the mapper 36 creates a matched block data structure for the block in question mapping the subject block to the matching block already stored in the stored block database 20. (The matching block corresponds to the matching proxy stored in the proxy database 22). If the block at issue (e.g., Block #1) is the last block in the new dataset 12 (block 112, FIG. 7C), control then returns to block 100 to await provision of another new dataset to process. Otherwise, if the block at issue (e.g., Block #1) is not the last block in the new dataset 12 (block 112), the proxy comparator 32 slides the block window by an appropriate amount as explained above in connection with FIG. 5 (e.g., in the case of a full block match, by the full block match amount) to define a new block (e.g., Block #2) in the buffer 30 (block 114). When appropriate, the data in the buffer 30 is shifted to add more of the dataset 12 to the end of the buffer 30 and drop already processed portions of the dataset from the buffer 30 to enable continued sequential processing of the dataset 12 (block 116). Control then returns to block 104 of FIG. 7A where the proxy calculator 32 computes the proxies for the newly defined block (e.g., Block #2).

Returning to block 106 of FIG. 7A, and assuming, for purposes of discussion, that the proxy comparator 32 did not find a match between the proxy for the full block at issue and the proxies in the proxy database 22, control advances to block 120. At block 120, the proxy comparator 34 compares the first half proxy for the block being processed to the list of half proxies stored in the proxy database 22 (block 120). If the first half proxy for the block under analysis is already present in the list (block 120), control advances to block 122. Otherwise, control advances to block 124 (FIG. 7B).

At block 122, the mapper 36 creates a matched block data structure (see, for example, FIG. 3) in the block map database 18 representative of the first half of the block of interest. Control then advances to block 124 (FIG. 7B).

Irrespective of whether control reaches block 124 via block 122 or directly from block 120, at block 124 the proxy comparator 34 determines whether the proxy for the second half of the block of interest is in the proxy database 22. If so, the mapper 36 creates a matched block data structure (see, for example, FIG. 3) in the block map database 18 representative of the second half of the block of interest (block 126). Control then advances to block 128 where it is determined if the first half proxy and the second half proxy for the block of interest were both matched. If so, the entire block of interest has been compressed such that no part of the block of interest is copied into the stored block database 20. Accordingly, control advances to block 112 (FIG. 7C). If the block of interest is the last block in the dataset 12 (block 112), then control returns to block 100 of FIG. 7A to begin processing of the next dataset to be compressed. Otherwise, the proxy calculator 32 slides the block window by the full block matched amount (block 114), the buffer 30 is updated, if necessary (block 116), and control returns to block 104 of FIG. 7A where processing of the next block begins.

Returning to FIG. 7B, if the proxy for the second half of the block of interest is not in the proxy database 22 (block 124), or if proxies for the first and second halves of the block of interest are not both matched (block 128), control advances to block 130. Blocks 130-134 are a loop wherein two to four of the quarter proxies are compared to the quarter proxies in the database to determine if there is a match. The number of quarter proxies examined depends on whether none or one of the proxies for the first and second halves of the block was matched in blocks 120-124. If no half block proxy was matched, then all four quarter proxies are examined. If one half block proxy was matched, then two quarter proxies are examined, namely, the two quarter proxies corresponding to the unmatched half of the block of interest. The quarter proxies of a matched half of the block of interest are not searched since the corresponding data will already have been compressed such that no further compression will be achieved by examining the quarter proxies.

At block 130, if the proxy for the first half of the block of interest was not matched, the proxy comparator 34 begins the loop by determining if the proxy for the first quarter of the block of interest is in the proxy database 22. If, on the other hand, the proxy for the first half of the block under analysis was matched, then the proxy comparator 32 begins the loop by determining if the proxy for the third quarter of the block of interest is in the proxy database 22. Irrespective of which quarter proxy is examined (block 130), if a match is found, the mapper 36 adds a matching block data structure (see, for example, FIG. 3) to the block map database 18 corresponding to the matching quarter of the block (block 132). If the proxy does not match a proxy already existing in the proxy database 18 (block 130), or after the mapper 36 creates a matched block data structure for the matched quarter block (block 132), control advances to block 134. At block 134, the apparatus 10 determines whether all of the quarter proxies to be examined have been searched against the proxy database 22. If not, control returns to block 130. Control continues to loop through blocks 130-134 until all of the quarter proxies that do not correspond to a matched half proxy have been searched. Control then advances to block 136.

At block 136, the mapper 36 determines whether the entire block of interest has been matched. If so, control advances through blocks 112-116 of FIG. 7C as explained above. If, however, any portion of the block of interest was not matched to a block or block portion already stored in the database 20, control advances to block 138 where the unmatched portion (s) of the block of interest are stored as one or more blocks in the stored block database 20 as explained above in connection with FIG. 5. Persons of ordinary skill in the art will appreciate that the unmatched portion(s) are preferably stored in the least amount of blocks possible. Thus, if none of the proxies were matched, then the full block of interest is stored as a single block. If, on the other hand, the full proxy is not matched, the first half proxy and the two quarter proxies corresponding to the first half of the block of interest are not matched, but the second half proxy is matched, then the unmatched half block will be stored as a single block rather than storing the unmatched quarter proxies as separate blocks. Similarly, if only the second quarter proxy of a given half of a block is matched, then the unmatched quarter of the block of interest proceeding the matched quarter of the block will be stored. (Unmatched end portions of blocks are overlapped with the next sequential block and examined for matches as explained above in connection with FIG. 5). If, on the other hand, the first and fourth quarters of the block are matched, but the full proxy, the half proxies and the second and third quarter proxies are not matched with proxies in the proxy database 22, then the unmatched second and third quarters of the block will be stored in the stored block database 20 as separate blocks. In other words, sequential unmatched quarter blocks from different halves of a block of interest are sometimes saved as separate blocks in the illustrated example. However, persons of ordinary skill in the art will appreciate that it would alternatively be possible to combine contiguous unmatched quarters into a single stored block.

After the unmatched portion(s) of the block of interest are added to the stored block database 22 (block 138), the mapper 36 creates corresponding unmatched data structures (see, for example, FIG. 4) in the block map database 18 (FIG. 7C, block 140). If the block of interest is the last block in the dataset 12 (block 142), control returns to block 100 of FIG. 7A to begin processing of the next dataset to be compressed. If the block of interest is not the last block in the dataset 12 (block 142), the proxy comparator 32 determines whether any portion of the block of interest was matched to a previously stored block (block 144). If no portion of the block of interest was matched, the proxy comparator 32 slides the block window by the unmatched block amount (block 146). If, however, any portion of the block of interest was matched (block 144), the proxy calculator 32 slides the block window by an amount to ensure that no matched portion of the block of interest is overlapped by the next block while unmatched portions at the end of the block are overlapped by the next block (block 114). The buffer 116 is then updated to include an additional amount of the dataset under examination, if necessary (block 116). Control then returns to block 104 where analysis of the next block begins.

Control continues to loop through blocks 104-116 until the entire dataset 12 has been processed and stored in the database 16.

As mentioned above, unmatched blocks or unmatched block portions may be stored in the block database 20verbatim, or may be compressed using any known compression algorithm prior to storage in the block database 20. For example, unmatched blocks and/or unmatched block portions may be compressed using a lossless compression technique such as the LZW algorithm.

Figure 8:
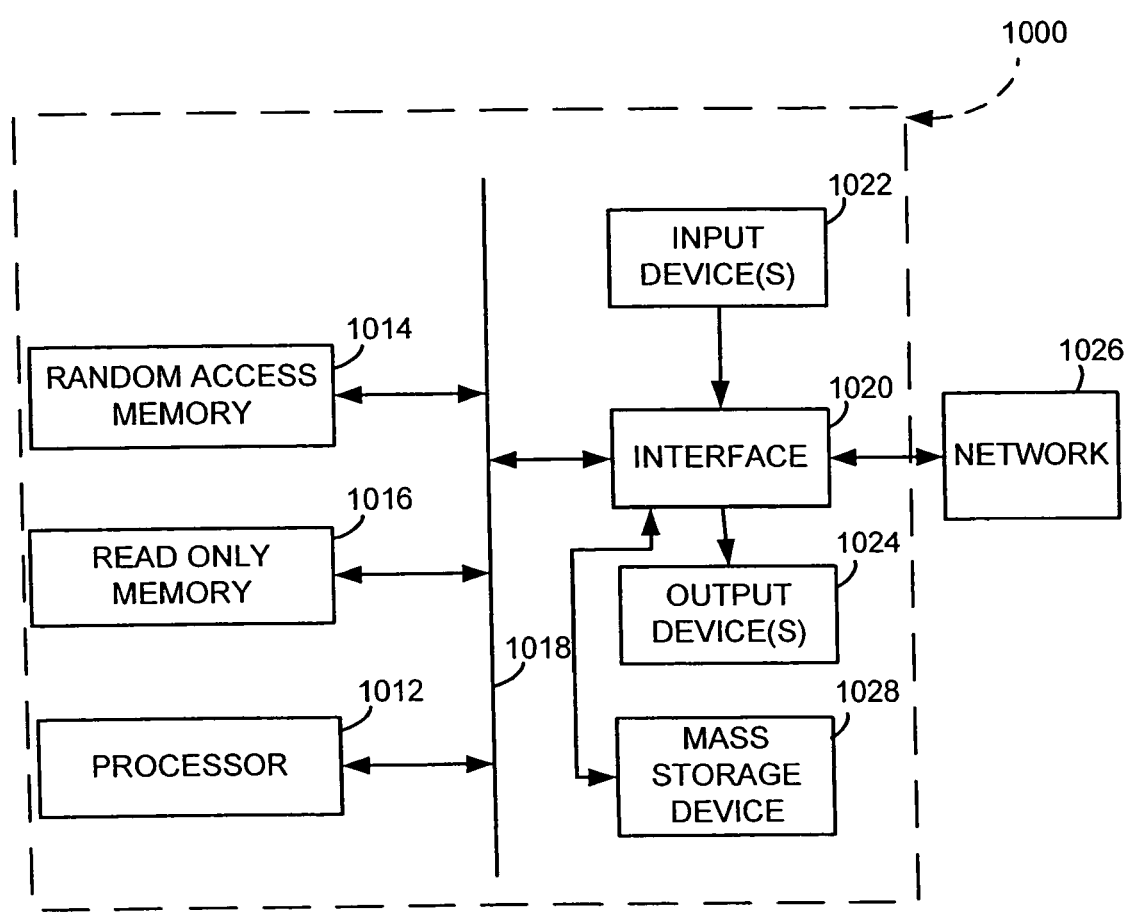
FIG. 8 is a schematic illustration of an example computer that may execute the machine accessible instructions represented by the flowcharts of FIGS. 7A-7C to implement the apparatus of FIGS. 1 and 2.

FIG. 8 is a block diagram of an example computer 1000 capable of implementing the apparatus and methods disclosed herein. The computer 1000 can be, for example, a server, a personal computer, a personal digital assistant (PDA), an Internet appliance, a DVD player, a CD player, a digital video recorder, a personal video recorder, a set top box, or any other type of computing device.

The system 1000 of the instant example includes a processor 1012. For example, the processor 1012 can be implemented by one or more Intel® microprocessors from the Pentium® family, the Centrino® family, the Itanium® family or the XScale® family. Of course, other processors from other families are also appropriate.

The processor 1012 is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is typically controlled by a memory controller (not shown) in a conventional manner.

The computer 1000 also includes a conventional interface circuit 1020. The interface circuit 1020 may be implemented by any type of well known interface standard, such as an Ethernet interface, a universal serial bus (USB), and/or a third generation input/output (3GIO) interface.

One or more input devices 1022 are connected to the interface circuit 1020. The input device(s) 1022 permit a user to enter data and commands into the processor 1012. The input device(s) can be implemented by, for example, a keyboard, a mouse, a touchscreen, a track-pad, a trackball, isopoint and/or a voice recognition system.

One or more output devices 1024 are also connected to the interface circuit 1020. The output devices 1024 can be implemented, for example, by display devices (e.g., a liquid crystal display, a plasma display screen, a cathode ray tube display (CRT), a printer and/or speakers). The interface circuit 1020, thus, typically includes a graphics driver card.

The interface circuit 1020 also includes a communication device such as a modem or network interface card to facilitate exchange of data with external computers via a network 1026 (e.g., an Ethernet connection, a digital subscriber line (DSL), a telephone line, coaxial cable, a cellular telephone system, etc.).

The computer 1000 also includes one or more mass storage devices 1028 for storing software and data. Examples of such mass storage devices 1028 include floppy disk drives, hard drive disks, compact disk drives and digital versatile disk (DVD) drives.

From the foregoing, persons of ordinary skill in the art will readily appreciate that apparatus and methods for compressing a dataset have been disclosed. A disclosed example method achieves lossless compression of a dataset 12 by determining whether blocks of the dataset 12 being compressed match blocks already stored in a database 16. The previously stored blocks may be part of the dataset 12 being compressed or of other datasets previously stored in the database 16. The database 16 can be local, remote and/or distributed such that a dataset to be compressed and stored on a first storage device such as a first server can be compressed based on datasets already stored on the first storage device and/or based on datasets already stored on a second storage device such as a second server networked to the first storage device. Thus, for example, if there is a large archive at location A, and it is desired to compress datasets at location B, copies of the proxy database 22 and the block map database 18 for the blocks stored at location A can be transmitted to location B to enable the datasets at location B to be compressed with reference to the blocks stored at location A. Since the proxy database 22 and the block map database 18 will typically be far smaller than the stored block database 20 (e.g., the proxy database 22 and the block map database 18 may together be about of 5% of the size of the stored block database 20), the data needed for compression can be quickly transferred from location A to location B. Persons of ordinary skill in the art will appreciate that, although only two storage devices and two locations are discussed in the above example, more than two storage devices and/or more than two locations may be used to compress a dataset if desired.

Although the methods and apparatus disclosed herein can be used to compress a single dataset, persons of ordinary skill in the art will readily appreciate that, because the disclosed methods and apparatus are capable of compressing a dataset by correlating blocks of a dataset to be compressed to blocks from other previously stored datasets, the disclosed methods and apparatus are particularly useful for large archive systems, local/remote backup systems and revision control systems. Experimental investigation indicates that the methods and apparatus disclosed herein may achieve more than ten times compression on large archival systems involving storing large sets of documents with commonalities (e.g., a large archive of Microsoft Power Point™ documents, Microsoft Outlook™ PST files, etc.) with short processing times.

Further, although in the above examples, the proxies are stored in a proxy database, the data structures for reconstructing a dataset are stored in a block database, and the stored blocks are stored in a stored database, persons of ordinary skill in the art will readily appreciate that the proxies, data structures and/or blocks may be stored in any desired manner (e.g., in separate files, combined files, separate databases, and/or one or more combined databases).

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to reduce electronic storage space consumption comprising:
    executing machine readable instructions within a computing device to:
        obtain a first block of a first computer readable file to be from a buffer in the computing device;
        compute a full proxy of the entire first block, a first half proxy for a first half of the first block, a second half proxy for a second half of the block, and a first quarter proxy, a second quarter proxy, a third quarter proxy, and a fourth quarter proxy for a first quarter of the first block, a second quarter of the first block, a third quarter of the first block, and a fourth quarter of the first block, respectively;
        compare the full proxy to a set of proxies representative of previously stored blocks, at least some of the previously stored blocks being from a second computer readable file, the second computer readable file being different from the first computer readable file;
        when the full proxy of the first block matches a first proxy in the set of proxies, to store a first data structure in the computing device that maps the entire first block to at least a portion of a first previously stored block associated with the first matching proxy without storing the first block;
        when the full proxy of the first block does not match any proxy in the set of proxies, to compare at least one of the first half proxy, the second half proxy, the first quarter proxy, the second quarter proxy, the third quarter proxy or the fourth quarter proxy to the set of proxies representative of previously stored blocks;
        when one of the first half proxy, the second half proxy, the first quarter proxy, the second quarter proxy, the third quarter proxy or the fourth quarter proxy matches a second proxy in the set of proxies, to store a second data structure in the computing device that maps the one of the first half proxy, the second half proxy, the first quarter proxy, the second quarter proxy, the third quarter proxy or the fourth quarter proxy to at least a portion of a second previously stored block associated with the second matching proxy without storing the portion of the first block corresponding to the one of the first half proxy, the second half proxy, the first quarter proxy, the second quarter proxy, the third quarter proxy or the fourth quarter proxy; and
        to obtain a second block of the first computer readable file, the first and second blocks being sequential, wherein when the full proxy for the first block matches a proxy in the set of proxies, the second block does not overlap with the first block, and when none of the full proxy, the first half proxy, the second half proxy, the first quarter proxy, the second quarter proxy, the third quarter proxy or the fourth quarter proxy of the first block matches a proxy in the set of proxies, the second block at least partially overlaps with the first block;
    wherein at least one of the first previously stored block and the second previously stored block is from the second computer readable file, and a first amount of storage space of the computing device used to store the first data structure, the second data structure, the first computer readable file and the second computer readable file by executing the machine readable instructions is less than a second amount of storage space of the computing device required to store the first and second computer readable files without executing the machine readable instructions.

2. The method as defined in claim 1, further comprising when none of the full proxy, the first half proxy and the first quarter proxy for the first block matches any proxy in the set of proxies, storing at least the first quarter of the first block.

3. The method as defined in claim 2, wherein storing the at least the first quarter of the first block comprises compressing the at least the first quarter of the first block prior to storing the at least the first quarter of the first block.

4. The method as defined in claim 1, further comprising:
    computing a second proxy for at least a portion of the second block;
    comparing the second proxy for the at least the portion of the second block to the set of proxies representative of previously stored blocks;
    when the second proxy for the at least the portion of the second block matches a proxy in the set of proxies, storing a data structure that maps the at least the portion of the second block to at least a portion of a previously stored block associated with the matching proxy without storing the at least the portion of the second block; and
    when the second proxy for the at least the portion of the second block does not match any proxy in the set of proxies, storing the at least the portion of the second block.

5. The method as defined in claim 1, further comprising, when none of the full proxy, the first half proxy, the second half proxy, the first quarter proxy, the second quarter proxy, the third quarter proxy and the fourth quarter proxy for the first block matches any proxy in the set of proxies, storing the full proxy, the first half proxy, the second half proxy, the first quarter proxy, the second quarter proxy, the third quarter proxy and the fourth quarter proxy for the first block in the set of proxies.

6. The method as defined in claim 1, wherein computing the full proxy for the first block comprises computing a hash function of the entire first block.

7. The method as defined in claim 1, wherein storing the data structure that maps the entire first block to the at least the portion of the previously stored block associated with the matching proxy comprises storing at least one of a file name associated with the previously stored block, a file offset correlating a start of the at least the portion of the first block to a start of the at least the portion of the previously stored block, or a block length of the first block.

8. The method as defined in claim 2, wherein storing the at least the first quarter of the first block comprises storing at least one of a block index and a block length of the at least the first quarter of the first block.

9. The method as defined in claim 1, further comprising when none of the full proxy, the first half proxy, the first quarter proxy and the second quarter proxy matches any proxy in the set of proxies, storing at least the first half of the first block.

10. The method as defined in claim 1, wherein when none of the full proxy, the first half proxy, the first quarter proxy, the second quarter proxy, the second half proxy and the third quarter proxy matches any proxy in the set of proxies, storing at least the first half and the third quarter of the first block.

11. An apparatus to compress a dataset comprising:
a block database storing a plurality of blocks of a plurality of stored datasets;
a block map mapping a block of a previously stored dataset to a block stored in the block database;
a compressor to compare an entire first block of the dataset to be compressed to at least a subset of the blocks of the datasets stored in the block database, to compare a first half of the first block of the dataset to be compressed to at least the subset of the blocks of the datasets stored in the block database when the entire first block does not match a block in the at least the subset of blocks, to compare a first quarter of the first block of the dataset to be compressed to at least the subset of the blocks of the datasets stored in the block database when neither the entire first block nor the first half of the first block matches a block in the at least the subset of blocks, to add at least the first quarter of the first block of the dataset to be compressed to the block database when none of the entire first block, the first half of the first block and the first quarter of the first block matches at least one of the stored blocks in the subset, and to map at least the first quarter of the first block of the dataset to be compressed to at least a portion of a block stored in the block database without adding the at least the first quarter of the first block to the block database when the at least the first quarter of the first block matches at least a portion of at least one of the stored blocks in the subset;
the compressor further comprising:
a proxy calculator to calculate a full proxy for the entire first block of the dataset to be compressed, a first half proxy for a first half of the first block, a second half proxy for a second half of the block, and a first quarter proxy, a second quarter proxy, a third quarter proxy, and a fourth quarter proxy for a first quarter of the first block, a second quarter of the first block, a third quarter of the first block, and a fourth quarter of the first block, respectively;
a proxy comparator to compare the full proxy for the entire first block of the dataset to be compressed to proxies for at least portions of the blocks in the at least a subset of the blocks stored in the block database; and
a mapper to map the entire first block of the dataset to be compressed to at least a portion of a block stored in the block database when the full proxy comparator identifies a match;
the proxy calculator to obtain a second block of the dataset, the first and second blocks being sequential, wherein when the full proxy for the first block matches a proxy in the set of proxies, the second block does not overlap with the first block, and when none of the full proxy, the first half proxy, the second half proxy, the first quarter proxy, the second quarter proxy, the third quarter proxy or the fourth quarter proxy of the first block matches a proxy in the set of proxies, the second block at least partially overlaps with the first block;
at least one of the compressor, the proxy calculator, the proxy comparator and the mapper comprising machine readable instructions stored on a tangible machine readable medium.

12. The apparatus as defined in claim 11, wherein the proxy comparator compares the first half proxy to a set of proxies representative of portions of blocks stored in the block database; and when the first half proxy matches a proxy in the set of proxies, the mapper maps the first half of the first block to a portion of a previously stored block associated with the matching proxy.

* * * * *